US010665665B2

(12) United States Patent
Yang et al.

(10) Patent No.: US 10,665,665 B2
(45) Date of Patent: May 26, 2020

(54) PASSIVATION MATERIAL FOR A PILLAR ADJACENT A TRENCH

(71) Applicant: Micron Technology, Inc., Boise, ID (US)

(72) Inventors: Guangjun Yang, Meridian, ID (US);
Mohd Kamran Akhtar, Boise, ID (US)

(*) Notice: Subject to any disclaimer, the term of this patent is extended or adjusted under 35 U.S.C. 154(b) by 9 days.

(21) Appl. No.: 16/167,016

(22) Filed: Oct. 22, 2018

(65) Prior Publication Data

US 2020/0127080 A1    Apr. 23, 2020

(51) Int. Cl.
| | | |
|---|---|---|
| H01L 21/00 | (2006.01) | |
| H01L 49/02 | (2006.01) | |
| H01L 21/3065 | (2006.01) | |
| H01L 21/02 | (2006.01) | |
| H01L 27/108 | (2006.01) | |
| H01L 23/31 | (2006.01) | |
| H01L 23/29 | (2006.01) | |
| H01L 21/311 | (2006.01) | |
| H01L 21/67 | (2006.01) | |

(52) U.S. Cl.
CPC ........ H01L 28/91 (2013.01); H01L 21/02118 (2013.01); H01L 21/02205 (2013.01); H01L 21/3065 (2013.01); H01L 21/31138 (2013.01); H01L 23/293 (2013.01); H01L 23/3171 (2013.01); H01L 27/1087 (2013.01); H01L 27/10829 (2013.01); *H01L 21/67069* (2013.01)

(58) Field of Classification Search
CPC ............... H01L 28/91; H01L 21/02118; H01L 21/02205; H01L 21/3065; H01L 21/31138; H01L 23/293; H01L 23/3171; H01L 27/10829; H01L 27/1087
See application file for complete search history.

(56) References Cited

U.S. PATENT DOCUMENTS

| | | | |
|---|---|---|---|
| 4,663,832 A | 5/1987 | Jambotkar | |
| 6,780,337 B2 | 8/2004 | Goldbach et al. | |
| 6,972,260 B2 | 12/2005 | Huang et al. | |
| 7,569,855 B2 | 8/2009 | Lai | |
| 8,242,012 B2 | 8/2012 | Daubenspeck et al. | |
| 2005/0029221 A1 | 2/2005 | Chang et al. | |
| 2015/0102386 A1* | 4/2015 | Chen | ................... H01L 23/3171 257/192 |
| 2019/0362984 A1* | 11/2019 | Katsunuma | ....... H01L 21/02244 |

* cited by examiner

*Primary Examiner* — Richard A Booth

(57) ABSTRACT

Systems, apparatuses, and methods related to passivation material for a pillar adjacent a trench are described. An example method includes forming a passivation material on a top region of a pillar adjacent a trench of a semiconductor device and removing a first portion of the passivation material to form, on a remaining second portion of the passivation material, a surface that is coplanar with an underlying sidewall of the pillar. The example method further includes removing a portion of a substrate material at a bottom region of the trench and removing the remaining second portion of the passivation material from the top region.

25 Claims, 6 Drawing Sheets

PASSIVATION MATERIAL FOR A PILLAR ADJACENT A TRENCH

TECHNICAL FIELD

The present disclosure relates generally to semiconductor devices and methods, and more particularly to passivation material for a pillar adjacent a trench.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
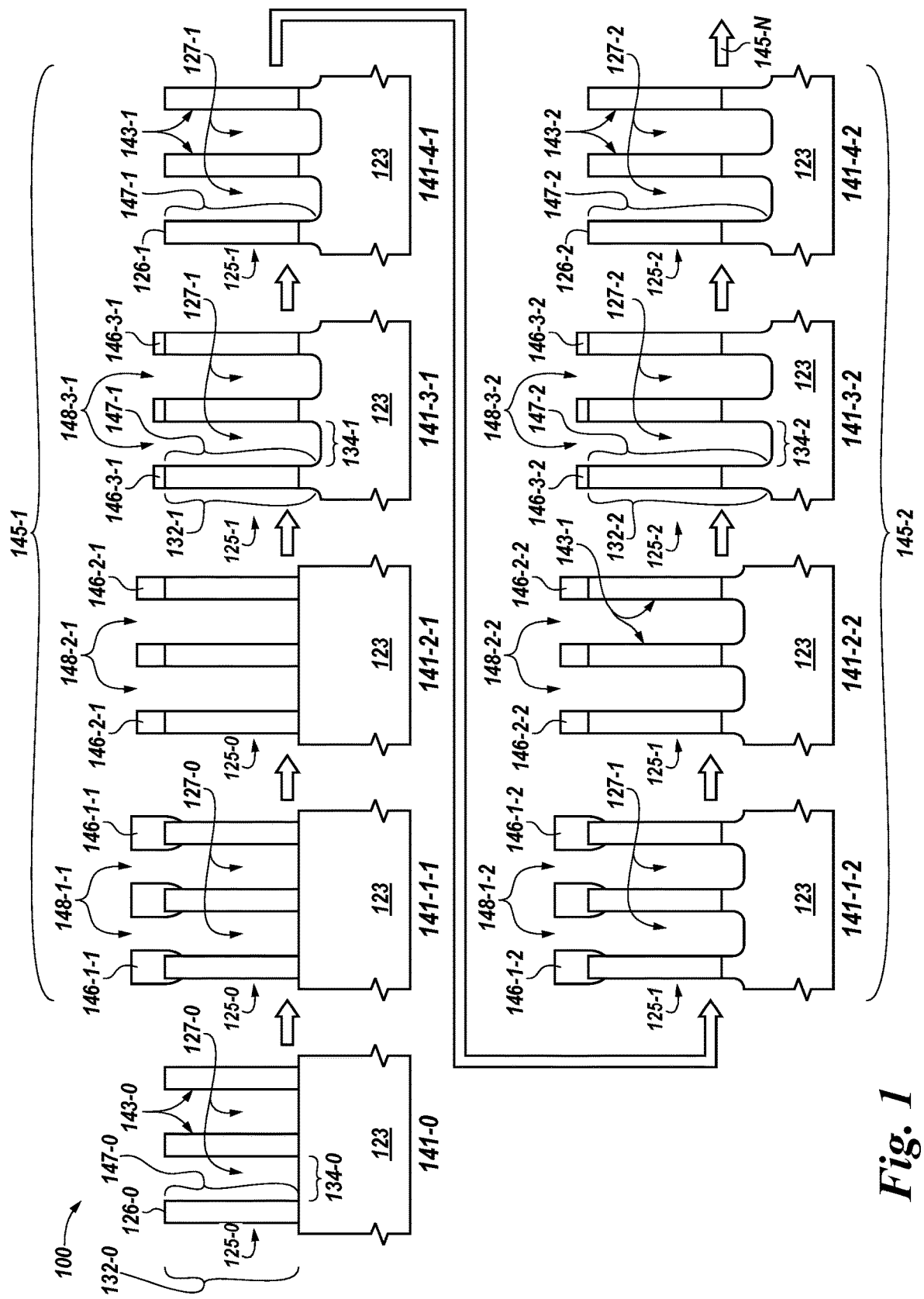
FIG. 1 illustrates a cross-sectional view of a portion of an example memory device at various points in time in an example fabrication sequence in accordance with a number of embodiments of the present disclosure.

Various types of memory devices may include trenches formed between sidewall structures (e.g., pillars). Various materials may be positioned in such trenches to contribute to data access, storage, and/or processing, among other functions and/or operations. As used herein, a "passivation material" is intended to mean a chemical compound that may be formed over a structural material of a semiconductor device in order to provide a barrier to reduce a potential for removal of (e.g., to protect) the structural material resulting from unintended consequences of subsequent processing of the semiconductor device.

A cyclic process is disclosed herein that may protect structural material of a top region of a pillar adjacent a trench from potential consequences of (e.g., removal during) an etch to remove a portion of a substrate material at a bottom region of the trench. Such an etch may, for example, be performed in order to deepen the trench into the substrate material. The protection may be conferred by a passivation material that forms a barrier over the top region having a resistance to an etching procedure that is higher than a resistance of the substrate material being etched at the bottom region of the trench. In a number of embodiments, the top region of the pillar may include a top surface of the pillar itself and other materials formed on the top surface of the pillar or elsewhere in the top region. Structural materials described herein as being formed on, or in association with, the top surface of the pillar adjacent the trench are termed as being in the top region of the pillar and/or trench. A depth of the trench approaching, at the top of, or into an underlying substrate material is termed a bottom region of the trench.

The present disclosure includes systems, apparatuses, and methods related to such a passivation material for a pillar adjacent a trench. An example of a method described herein includes forming a passivation material on a top region of a pillar adjacent a trench of a semiconductor device and removing a first portion of the passivation material to form, on a remaining second portion of the passivation material, a surface that is coplanar with an underlying sidewall of the pillar. The example method further includes removing a portion of a substrate material at a bottom region of the trench and removing the remaining second portion of the passivation material from the top region.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of memory devices can refer to one or more memory devices and a number of iterations of particular elements recited in a claim can refer to performing the particular elements in one or more cycles.

The figures herein follow a numbering convention in which the first digit or digits correspond to the figure number of the drawing and the remaining digits identify an element or component in the drawing. Similar elements or components between different figures may be identified by the use of similar digits. For example, 127 may reference element "27" in FIG. 1, and a similar element may be referenced as 627 in FIG. 6. In some instances, a plurality of similar, but functionally and/or structurally distinguishable, elements or components in the same figure or in different figures may be referenced sequentially with the same element number (e.g., 127-0, 127-1, and 127-2 in FIG. 1).

FIG. 1 illustrates a cross-sectional view of a portion of an example memory device at various points in time in an example semiconductor fabrication sequence 100. The fabrication sequence 100 illustrated in FIG. 1 is shown at points 141 in time that correspond to processing activities being performed in the fabrication sequence 100. The points 141 illustrate the structural features after various processing activities have been performed along the fabrication sequence 100. The fabrication sequence 100 may include repetition of particular fabrication processing activities (steps) through a number of iterations (cycles). Other processing activities may be omitted from FIG. 1 for simplicity. The illustrated processing activities may correspond to formation and removal of structural features. Formation of structural features may, for example, include deposition of a passivation material 146. Deposition of the passivation material 146 may, in a number of embodiments, include deposition of a hydrocarbon polymer precursor to form a hydrocarbon polymer material or layer. Removal of structural features may, for example, include etching to remove features on a portion of the passivation material 146 and a portion of a substrate material 123 at a bottom region of a trench 127.

The processing activities are illustrated in FIG. 1 as being performed in cycles 145-1, 145-2, . . . , 145-N. Each cycle 145 is shown to include four processing activities. The four processing activities (e.g., operations) may be utilized in etching a trench 127 to an intended depth 147-1, 147-2 in the substrate material 123, while protecting a top region of a pillar 125-1, 125-2 and/or the trench 127 from unintended consequences of the etch process utilized in etching the bottom region of the trench 127.

The fabrication sequence 100 may begin at point 141-0 with the portion of the example memory device configured to include pillars 125-0, each pillar having a top surface 126-0. A pillar, as described herein, may be formed from one or more semiconductor materials. Each pillar 125-0 may be formed to extend to a first height 132-0 above an original upper surface of the substrate material 123. The first height 132-0 of a pillar 125-0 may correspond to a first depth 147-0 of an adjacent trench 127-0. A distance by which each pillar 125-0 is separated from another pillar may define a first width 134-0 of the trench 127-0 between sidewalls 143-0 of the pillars 125-0. The sidewalls 143-0 of the pillars 125-0 may alternatively be termed sidewalls 143-0 of the trench 127-0, depending on the context.

Etching may be utilized to form trenches, defined structures, separate regions, etc. The width of trenches may vary according to an intended purpose, materials to be formed (e.g., deposited) therein, design rule specifications, etc. The width 134-0 of the trench 127-0 between the sidewalls 143-0 may vary at different positions along the depth 147-0 of the trench 127-0. Variation in the width of the trench within or between the top region, the bottom region, and a region between the top and bottom regions may be influenced by an aspect ratio (AR) of the trench. The AR is determined by the height relative to the width of the trench. For example, a higher trench AR may be associated with a greater difference between a width of the trench in the top region relative to a width of the trench in the bottom region. In this example, the difference may be based on the width in the top region being greater than the width in the bottom region relative to such a difference for a trench with a lower AR. As described herein, such a difference in the width of the trench in the top region versus the width in the bottom region may be reduced (e.g., prevented) when passivation material is applied to protect the top region of the pillar during the etch of the bottom region.

In addition to an unintended increase in a width of at least a portion of a trench 127, etching of the substrate material 123 at the bottom region of the trench 127, when no passivation material has been applied to protect the top region of the pillar 125, may increase occurrence of other unintended consequences. Such unintended consequences may include an unintended effect on one or more critical dimensions (CDs) of the top region of a pillar 125 and/or an adjacent trench 127. The CDs may be dimensions of final structures of a top region of a pillar 125, a sidewall 143 of a pillar 125, a width of a pillar 125, a width of a trench 127, and/or a depth of a trench 127, among other possible CDs.

For example, unintended consequences on the top region of a pillar 125 may include removal of material resulting in reduction in the height 132 of the top surface 126 of the pillar 125 and/or rounding or clipping of an edge (e.g., shoulder) of the top surface 126 of the pillar 125. The unintended consequences on the top region of the pillar 125 also may include removal of a material 631 formed on the top surface 126, a mask 633, a transistor 626, a wordline 635, and/or a bitline 637 associated with the top surface 126 of the pillar 125, as shown and described in connection with FIG. 6. Deposition of passivation material 146 over the structural materials just mentioned prior to etching of the substrate material 123 at the bottom region of the trench 127 may protect these structural materials such that removal of material is reduced (e.g., prevented) during etching of the substrate material 123. As such, use of the passivation material 146 may protect against unintended changes to these CDs.

The passivation material 146 may be formed at the top region of a pillar 125. The passivation material 146 may be a hydrocarbon polymer ($C_xH_y$) formed from a hydrocarbon polymer precursor. The hydrocarbon polymer precursor may be formed from at least one of methane ($CH_4$), acetylene ($C_2H_2$), ethylene ($CH_2CH_2$), ethane ($CH_3CH_3$), and/or propane ($CH_3CH_2CH_3$), among other possible hydrocarbons. The hydrocarbon polymer precursor and/or the hydrocarbon polymer may be formed and deposited by processes such as chemical vapor deposition, plasma-enhanced chemical vapor deposition, pulsed laser deposition, sputter deposition, atomic layer deposition, and/or molecular beam epitaxy, among other suitable deposition processes.

At point 141-1-1 in the first cycle 145-1 shown in FIG. 1, the hydrocarbon polymer precursor has been applied (e.g., in a gaseous phase) to the top region of the pillars 125-0 to form a hydrocarbon polymer as the passivation material 146-1-1. The passivation material 146-1-1 may be formed (e.g., deposited) primarily on the top region of the pillars 125-0 such that the passivation material 146-1-1 may have a mushroom-shaped configuration (e.g., based on non-conformal deposition) on at least some of the pillars. As such, at least some of the gaps 148-1-1 between the passivation material 146-1-1 at the top region of the pillars 125-0 may be narrower than the width 134-0 of the underlying trench 127-0 that extends into the bottom region. In some instances, the passivation material 146-1-1 on neighboring pillars 125-0 may have mushroom-shaped configurations wide enough to close (e.g., pinch off) an intended opening at a top of the trench 127-0 between the neighboring pillars 125-0.

At point 141-2-1 in the first cycle 145-1, a first portion of the passivation material 146-1-1 (e.g., the portion of the mushroom-shaped configuration extending over the width 134-0 of trench 127-0) is shown as being removed (e.g., trimmed and/or etched) to form a surface on a remaining second portion of the passivation material 146-2-1 on the top region of the pillar 125-0. The surface of the remaining second portion of the passivation material 146-2-1 may vertically align (e.g., be coplanar) with an underlying sidewall 143-0 of the pillar 125-0. A bottom of the remaining second portion of the passivation material 146-2-1 may end contiguous with the top surface 126-0 of the pillar 125-0. The removal of the first portion extending over the width 134-0 of trench 127-0 and the remaining second portion of the passivation material 146-2-1 being coplanar with and ending contiguous with the top surface 126-0 of the pillar 125-0 may increase the width of gaps 148-2-1 between the passivation material 146-2-1 at the top region of the pillars 125-0. Hence, the width of the gaps 148-2-1 may be substantially the same as the width 134-0 of the underlying trench 127-0.

At point 141-3-1 in the first cycle 145-1, a portion of the material of the substrate 123 is shown to have been removed by an etch process (e.g., a punch etch) to a first depth into the substrate 123. By etching to the first depth into the substrate 123, a second height 132-1 of the pillar 125-1 and a second depth 147-1 of the trench 127-1 have each been increased relative to the corresponding first height 132-0 and first depth 147-0.

A side effect (e.g., an unintended consequence) of performance of the punch etch on the substrate 123 may be that at least a portion of the remaining second portion of the passivation material 146-3-1 also has been removed. A thickness of the second portion of the passivation material 146-2-1 remaining after removal of the first portion may have been predetermined such that performance of the punch etch does not remove all of the remaining second portion of the passivation material 146-3-1. Alternatively or in addition, a thickness of the remaining second portion of the passivation material 146-3-1 may be monitored during the performance of the punch etch to stop the punch etch to prevent removal of all of the remaining second portion of the passivation material 146-3-1.

The remaining second portion of the passivation material 146-3-1 may thus still protect the top region of the pillar 125-0 from unintended consequences of the punch etch. For example, the remaining second portion of the passivation material 146-3-1 may act as a barrier to reduce a probability of exposure of the top surface 126-0 of the pillar 125-0 to the etch chemistry of the punch etch. Hence, protection of the top region of the pillar 125-0 may preserve the original height 132-0 of the pillar 125-0, relative to the contact with the substrate material 123, and/or a configuration of a shoulder of the top surface 126-0 of the pillar 125-0 (e.g., by protecting from rounding and/or clipping of an edge). Protection of the top region of the pillar 125-0 also may preserve the width and/or reduce widening of the width of gaps 148-3-1 between the passivation material 146-3-1 and/or the top surfaces 126-0 of the pillars 125-1 at the top region. As such, the width between the top surfaces 126-0 may remain substantially the same as the width 134-1 of the underlying trench 127-1 after performance of the punch etch.

Performance of the punch etch with protection of the top region by the passivation material 146-3-1 may protect from an unintended accumulation of the originally deposited passivation material 146-1-1 along the sidewalls 143-0 of the pillars 125-0 and/or at the bottom region of the trench 127-1. The unintended accumulation of the originally deposited passivation material 146-1-1 may be reduced (e.g., prevented) by exposure of the originally deposited passivation material 146-1-1 along the sidewalls 143-0 of the pillars 125-0 and at the bottom region of the trench 127-1 to the punch etch while simultaneously protecting the top region of the pillars 125-0. Hence, performance of the punch etch with protection of the top region by the passivation material 146-3-1 also may protect from an unintended increase in a width of at least a portion of the trench (e.g., in the top region). Performance of the punch etch with protection of the top region by the passivation material 146-3-1 also may protect from an unintended reduction in the width and an increase in roughness (e.g., line width roughness (LWR) and/or space width roughness (SWR)) of at least a portion of a sidewall 143-0 and/or a bottom region of the trench 127-1.

At point 141-4-1 in the first cycle 145-1, the remaining second portion of the passivation material 146-3-1 may be removed. The passivation material 146-3-1 may be removed via performance of a selective hydrocarbon removal process described herein. The height of the top surface 126-1 of the pillars 125-1 and/or the width between the sidewalls 143-1 of the pillars 125-1, and consequently the width 134-1 of the trenches 127-1, may be protected to (e.g., be substantially the same as) the corresponding heights and/or widths at point 141-0 after performance of the first punch etch to reach the first depth in the substrate 123, during the first cycle 145-1. The second depth 147-1 of the trenches 127-1 may thus be accomplished.

When the second depth 147-1 of the trenches 127-1 accomplished during the first cycle 145-1 does not reach an intended final depth in the substrate 123 and/or an intended final depth of the trench 127, additional cycles that each include an additional punch etch may be performed to reach the intended final depth. For example, at point 141-1-2 in second cycle 145-2, fresh hydrocarbon polymer precursor may be applied to the top region of the pillars 125-1 to form a new hydrocarbon polymer as passivation material 146-1-2. The new passivation material 146-1-2 may replace the remaining second portion of the passivation material 146-3-1 removed at point 141-4-1 in the first cycle 145-1. The passivation material 146-1-2 may have the same or different hydrocarbon material or materials as in cycles 145-1 and/or 145-N.

In some instances, the new passivation material 146-1-2 also may have a mushroom-shaped configuration as described in connection with point 141-1-1. As such, at least some of the gaps 148-1-2 between the passivation material 146-1-2 at the top region of the pillars 125-1 may again be narrower than the width 134-1 of the underlying trench 127-1 that extends into the bottom region.

At point 141-2-2 in the second cycle 145-2, a first portion of the passivation material 146-1-2 is again shown as being trimmed to form a surface on a remaining second portion of the passivation material 146-2-2 on the top region of the pillar 125-1 that may be coplanar with an underlying sidewall 143-1 of the pillar 125-1. The removal of the first portion extending over the width 134-1 of trench 127-1 and the remaining second portion of the passivation material 146-2-2 being coplanar with the pillar 125-1 may increase the width of gaps 148-2-2 between the passivation material 146-2-2 at the top region of the pillars 125-1 such that the width may again be substantially the same as the width 134-1 of the underlying trench 127-1.

At point 141-3-2 in the second cycle 145-2, an additional portion of the material of the substrate 123 is shown to have been removed by a second punch etch to a second depth into the substrate 123 that is deeper than the first depth described in connection with point 141-3-1 of the first cycle 145-1. By etching to the second depth into the substrate 123, a third height 132-2 of the pillar 125-2 and a third depth 147-2 of the trench 127-2 have each been increased relative to the corresponding second height 132-1 and second depth 147-1.

Performance of the second punch etch on the substrate 123 also may remove at least a portion of the remaining second portion of the passivation material 146-3-2. However, the remaining second portion of the passivation material 146-3-2 may still protect the top region of the pillar 125-2 from unintended consequences of the second punch etch as described in connection with point 141-3-1 in the first cycle 145-1.

At point 141-4-2 in the second cycle 145-2, the remaining second portion of the passivation material 146-3-2 again may be removed via performance of the selective hydrocarbon removal process described herein. As such, the height of the top surface 126-2 of the pillars 125-2 and/or the width between the sidewalls 143-2 of the pillars 125-2, and consequently the width 134-2 of the trenches 127-2, may be protected to (e.g., be substantially the same as) the corresponding heights and/or widths at point 141-0 and/or point 141-4-1 after performance of the second punch etch to reach the second depth in the substrate 123 during the second cycle 145-2.

When the third depth 147-2 of the trenches 127-2 accomplished during the first cycle 145-1 and the second cycle 145-2 still has not reached the intended final depth in the substrate 123 and/or the intended final depth of the trench 127, additional cycles 145-N that each include an additional punch etch may be performed. A number of the additional cycles 145-N to be performed may depend on how many punch etches it takes to reach the intended final depth. At the beginning of each of the additional cycles, new passivation material 146 is formed on the top region of the pillars to replace the previously removed passivation material. At least a portion of the thickness of the remaining second portion of the new passivation material is left to protect the top region of the pillar from the unintended consequences of the additional punch etch.

When the passivation material 146 is not trimmed after deposition to conform to a width of a pillar 125 and a width of a trench 127 between sidewalls 143 of pillars 125, a variation may result in a focus and/or effect of the etch of the substrate material 123 that may have an unintended consequence on one of more of the CDs. Moreover, addition of more passivation material 146 without removal of remaining passivation material at the end of each cycle 145 may result in accumulation of passivation material 146 that does not conform to the width of the pillar 125 and the width of the trench 127 such that one or more of the CDs may drift as the number of cycles 145 increases.

In other deposition/etch processes that utilize an $SiO_2$ polymer or a fluorocarbon polymer for passivation of underlying materials, such polymers may not be trimmed during each cycle and/or may not be removed at the end of each cycle. Hence, small variations in the width, height, size, shape, etc., of such passivation materials following the associated deposition and/or etch processes may result in large drifts or shifts of one or more CDs.

A trim process performed in cycle 145-1 on the passivation material 146-2-1 at point 141-2-1 and in cycle 145-2 on the passivation material 146-2-2 at point 141-2-2 and a removal process performed in cycle 145-1 on a remaining passivation material 146-3-1 at point 141-4-1 and in cycle 145-2 on a remaining passivation material 146-3-2 point 141-4-2 each may be made selective to the hydrocarbon polymer used to form the passivation material 146. For example, the trim process shown at points 141-2-1 and 141-2-2 may, in a number of embodiments, be performed on the hydrocarbon polymer using at least one of a combination of tetrafluoromethane ($CF_4$) and sulfur dioxide ($SO_2$), a combination of nitrogen trifluoride ($NF_3$) and $SO_2$, and/or an oxygen ($O_2$) based etch chemistry (e.g., $Cl_2/HBr/O_2$). The removal process shown at points 141-4-1 and 141-4-2 may, in a number of embodiments, be performed on the remaining hydrocarbon polymer using at least one of an oxidated compound etch chemistry and/or an $O_2$ plasma, which may be supplemented with low concentrations of $CF_4$ and/or $NF_3$.

In contrast, the pillar material 125 may be formed, at least in part, from an inorganic oxide and/or nitride and the substrate material 123 may be formed from at least one of an inorganic oxidated compound, an inorganic nitrogenated compound, an inorganic silicide or silicate compound, and/or a polysilicon compound. The substrate material 123 in the bottom region may be etched using an etch chemistry that is appropriate for the material of the substrate. The hydrocarbon polymer of the passivation material 146 has a higher etch resistance relative to the substrate material 123 when an etch chemistry (e.g., a chemistry of a gas or plasma) has a lower oxygen content, such as $O_2$, CO, or $SO_2$ concentrations, and/or when the etch chemistry has a higher C/F ratio. Such an etch chemistry may include at least one of a combination of $CF_4$ and $SO_2$ and/or a combination of $NF_3$ and $SO_2$. The hydrocarbon polymer of the passivation material 146 has a higher etch resistance to the higher $CF_4$ or $NF_3$ to $SO_2$ ratio used for the substrate material 123 etch chemistries. In contrast, the inorganic materials of the substrate 123 and/or pillars 125 have a higher etch resistance to the lower $CF_4$ or $NF_3$ to $SO_2$ ratio used for the hydrocarbon polymer etch chemistries. In some embodiments, a non-selective etch chemistry of $CF_4$ and helium (He) may be used to etch the substrate material 123.

Figure 2:
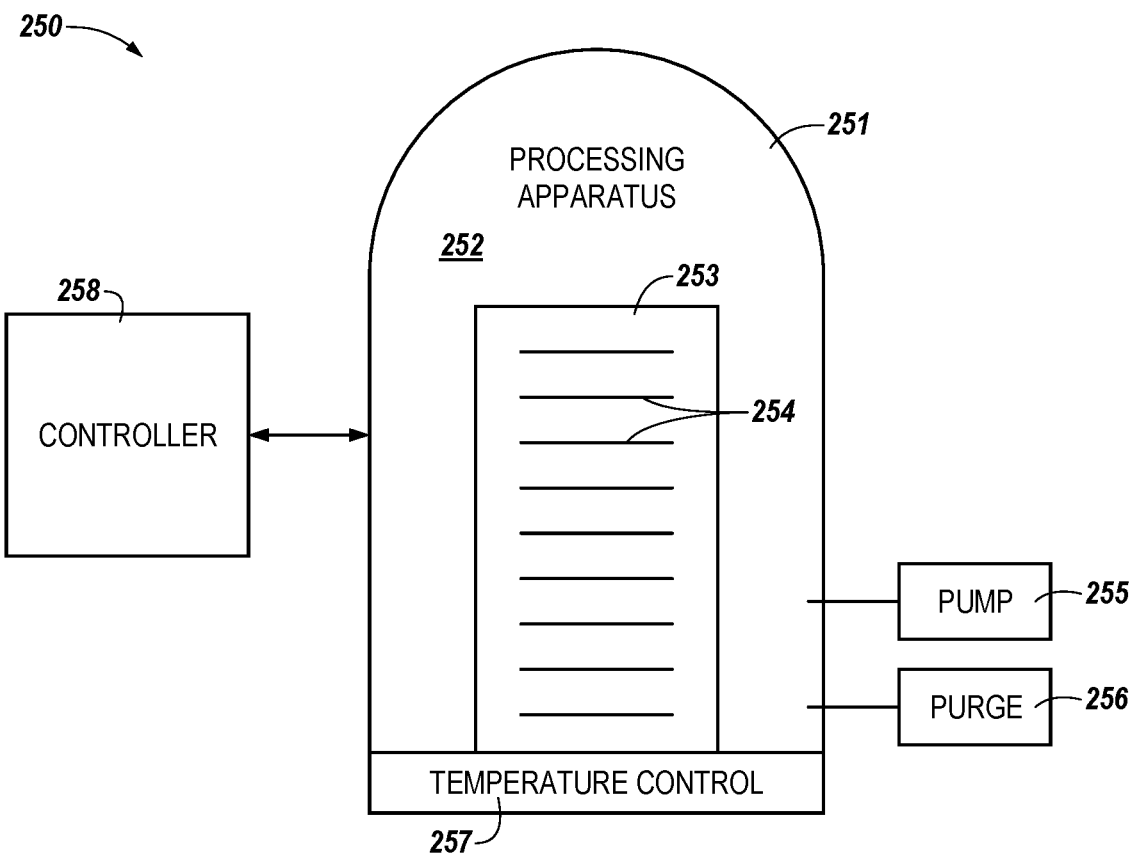
FIG. 2 is a functional block diagram of a system for implementation of an example semiconductor fabrication process in accordance with a number of embodiments of the present disclosure.

FIG. 2 is a functional block diagram of a system 250 for implementation of an example semiconductor fabrication process in accordance with a number of embodiments of the present disclosure. The system 250 may include a processing apparatus 251. The processing apparatus 251 may be configured to enable formation of structural materials on and/or removal of structural materials from a semiconductor device during fabrication of the semiconductor device.

The processing apparatus 251 may include a chamber 252 to enclose components configured to perform deposition and/or etch operations on a number of semiconductor devices (e.g., wafers on which memory devices 512 or arrays 514 are being formed by the example semiconductor fabrication sequence 100). The chamber 252 may further enclose a carrier 253 to hold a batch of semiconductor wafers 254. The processing apparatus 251 may include and/or be associated with tools including, for example, a pump 255 unit and a purge 256 unit configured to introduce and remove appropriate etch chemistries, as described herein, at each point in the semiconductor fabrication sequence (e.g., as described in connection with the fabrication sequence 100 shown in FIG. 1). The processing apparatus 251 may further include a temperature control 257 unit configured to maintain the chamber 252 at an appropriate temperature at each of the points in the fabrication sequence 100. The system 250 may include a number of chambers 252 that are each configured to perform particular processes (e.g., a wet etch process, a dry etch process, and/or a deposition process, among others) during the fabrication sequence 100.

The system 250 may further include a controller 258. The controller 258 may include, or be associated with, circuitry and/or programming for implementation of, for instance, deposition and removal of passivation material for pillars adjacent a trench, along with etching of substrate material. Adjustment of such deposition, removal, and etching operations by the controller 258 may control the critical dimensions (CDs) of the semiconductor devices created in the processing apparatus 251.

A host may be configured to generate instructions related to protection of a top region of a pillar and an adjacent trench during removal of a substrate material at a bottom region of a trench of the semiconductor device. An example of a host is shown at 502 in FIG. 5, although embodiments are not limited to being coupled to the memory system 504 shown in FIG. 5. The instructions may be sent via a host interface 503 to the controller 258 of the processing apparatus 251. The instructions may be based at least in part on scaled preferences (e.g., in numerically and/or structurally defined gradients) stored by the host 502, provided via input from another storage system (not shown), and/or provided via input from a user (e.g., a human operator), among other possibilities. The controller 258 may be configured to enable input of the instructions and scaled preferences to define the CDs of the fabrication of the semiconductor device to be implemented by the processing apparatus 251 based at least in part on performance of the four operations presented below and described in more detail in connection with FIG. 1.

The scaled preferences may determine final structures (e.g., the CDs) of the top region of the pillar, a sidewall of the pillar, a width of the pillar, a width of the trench, and/or a depth of the trench. Particular CDs may be enabled by the particular scaled preferences that are input via the instructions. Receipt and implementation of the scaled preferences by the controller 258 may result in corresponding adjustment, by the processing apparatus 251, of a deposition time for the passivation material, adjustment of a coverage area, height, and/or volume of the passivation material, adjustment of a trim direction and/or trim time performed on the passivation material, and/or adjustment of punch etch direction and/or punch etch time performed on the substrate material, among implementation of other possible scaled preferences.

The controller 258 may, in a number of embodiments, be configured to use hardware as control circuitry. Such control circuitry may, for example, be an application specific integrated circuit (ASIC) with logic to control fabrication steps, via associated deposition and etch processes, for pillar formation adjacent a trench, along with formation of passivation material on and removal of the passivation material from the pillar and the trench.

The controller 258 may be configured to receive the instructions and direct performance of operations, corresponding to the instructions, by the processing apparatus 251. In a number of embodiments, the four operations performed by the processing apparatus 251 may be to form a passivation material on a top region of a pillar adjacent the trench, remove a first portion of the passivation material to form, on a remaining second portion of the passivation material, a surface that is coplanar with an underlying sidewall of the pillar, remove a portion of the substrate material at the bottom region of the trench, and remove the remaining second portion of the passivation material from the top region.

The controller 258 may be configured to implement the instructions to control a quantity of the passivation material that is formed on and removed from the top region of the pillar. The quantity of the passivation material may be controlled to adjust a quantity of material associated with the top region of the pillar that is removed, a width of a least a portion of the trench, a roughness of at least a portion of a sidewall of the trench, and/or a width of a least a portion of the pillar. The controller 258 may be configured to implement the instructions to control a depth of the removal of the substrate material based at least in part on a quantity of the second portion of the passivation material remaining on the top region to protect an underlying material of the top region. For example, a punch etch being performed on the substrate material may be stopped at a depth that coincides with the second portion of the passivation material remaining on the top region being reduced to a predetermined thickness that is determined to be adequate for protection of the underlying material of the top region. The controller 258 may be configured to implement the instructions to control reaching an intended depth of the removal of the substrate material based at least in part on a number of iterations of the four operations presented above.

Figure 3:
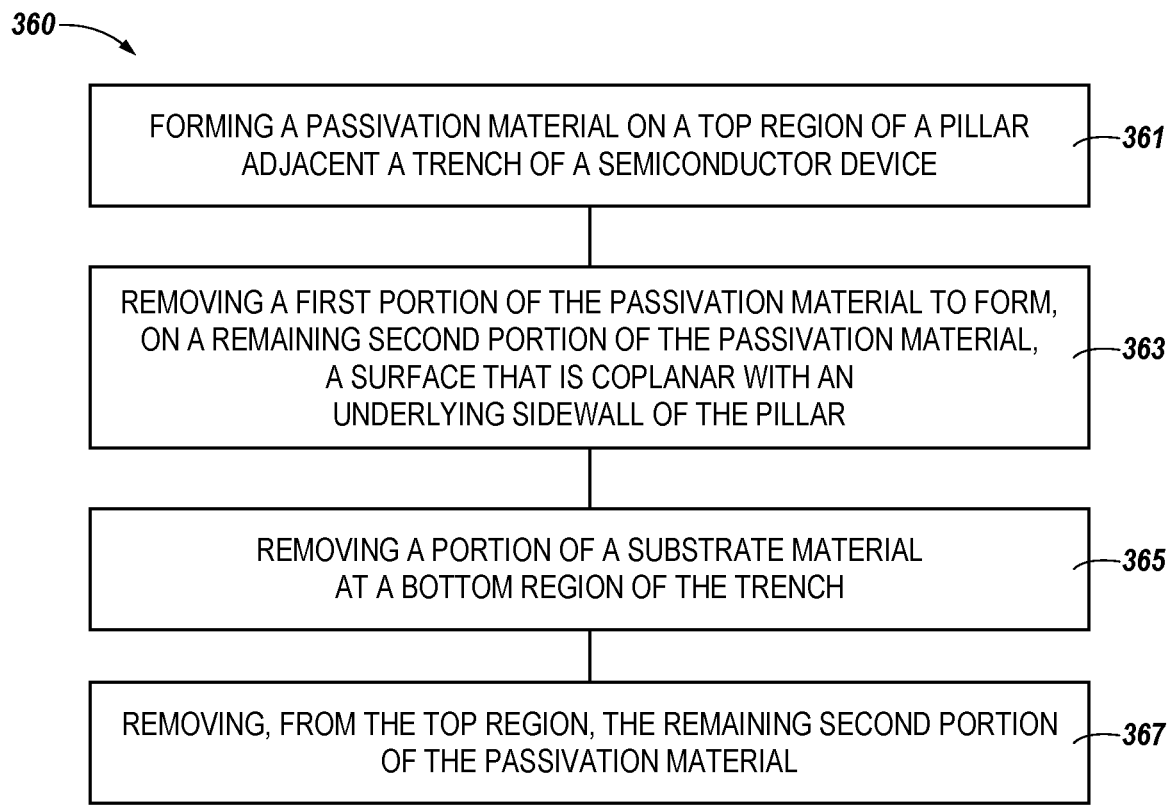
FIG. 3 is a flow diagram of an example method for using passivation material for pillars adjacent a trench in accordance with a number of embodiments of the present disclosure.

FIG. 3 is a flow diagram of an example method 360 for using passivation material for pillars adjacent a trench in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 361, the method 360 may include forming a passivation material on a top region of a pillar adjacent a trench of a semiconductor device (e.g., as described in connection with point 141-1-1 in FIG. 1). At block 363, the method 360 may include removing a first portion of the passivation material to form, on a remaining second portion of the passivation material, a surface that is coplanar with an underlying sidewall of the pillar device (e.g., as described in connection with point 141-2-1 in FIG. 1). At block 365, the method 360 may include removing a portion of a substrate material at a bottom region of the trench (e.g., as described in connection with point 141-3-1 in FIG. 1). At block 367, the method 360 may include removing the remaining second portion of the passivation material from the top region (e.g., as described in connection with point 141-4-1 in FIG. 1).

As described herein, removing the first portion of the passivation material may further include removing the passivation material formed on the underlying sidewall of the pillar. Removing the first portion of the passivation material may further include removing the passivation material formed at the bottom region of the trench.

The method 360 may, in a number of embodiments, further include, prior to removing the remaining second portion of the passivation material from the top region, leaving the remaining second portion on the top region to protect an underlying material of the top region from a subsequent removal of the substrate material. The method 360 may further include, prior to forming the passivation material on the top region of the pillar, forming a material (e.g., as shown at 631 and 633 and described in connection with FIG. 6) on a top surface of the pillar, and leaving the remaining second portion on the top region to protect the material and/or the top surface of the pillar from a subsequent removal of the substrate material.

The method 360 may further include reiterating the elements recited in boxes 361, 363, 365, and 367 to remove an additional portion of the substrate material at the bottom region of the trench. The method 360 may further include reducing a probability of an unintended effect on CDs of the top region of the pillar and/or an adjacent trench relative to removal of the portion of the substrate material at the bottom region of the trench, as recited in box 365, without performance of the other elements recited in boxes 361, 363, and 367.

The method 360 may, in a number of embodiments, further include reducing a probability of an unintended pinch-off of the trench adjacent the pillar caused by formation of the passivation material in one or more cycles on the top region of the pillar (e.g., based on performance of elements recited in boxes 363 and 367). The method 360 may further include reducing a probability of an unintended removal of material associated with the top region of the pillar (e.g., based on performance of elements recited in boxes 361, 363, and 367). The method 360 may further include reducing a probability of an unintended accumulation of passivation material at the bottom region of the trench (e.g., based on performance of elements recited in boxes 363, 365, and 367). The method 360 may further include reducing a probability of an unintended increase in a width of at least a portion of the trench and/or an unintended increase in roughness of at least a portion of a sidewall of the trench (e.g., based on performance of elements recited in boxes 361-367).

Figure 4:
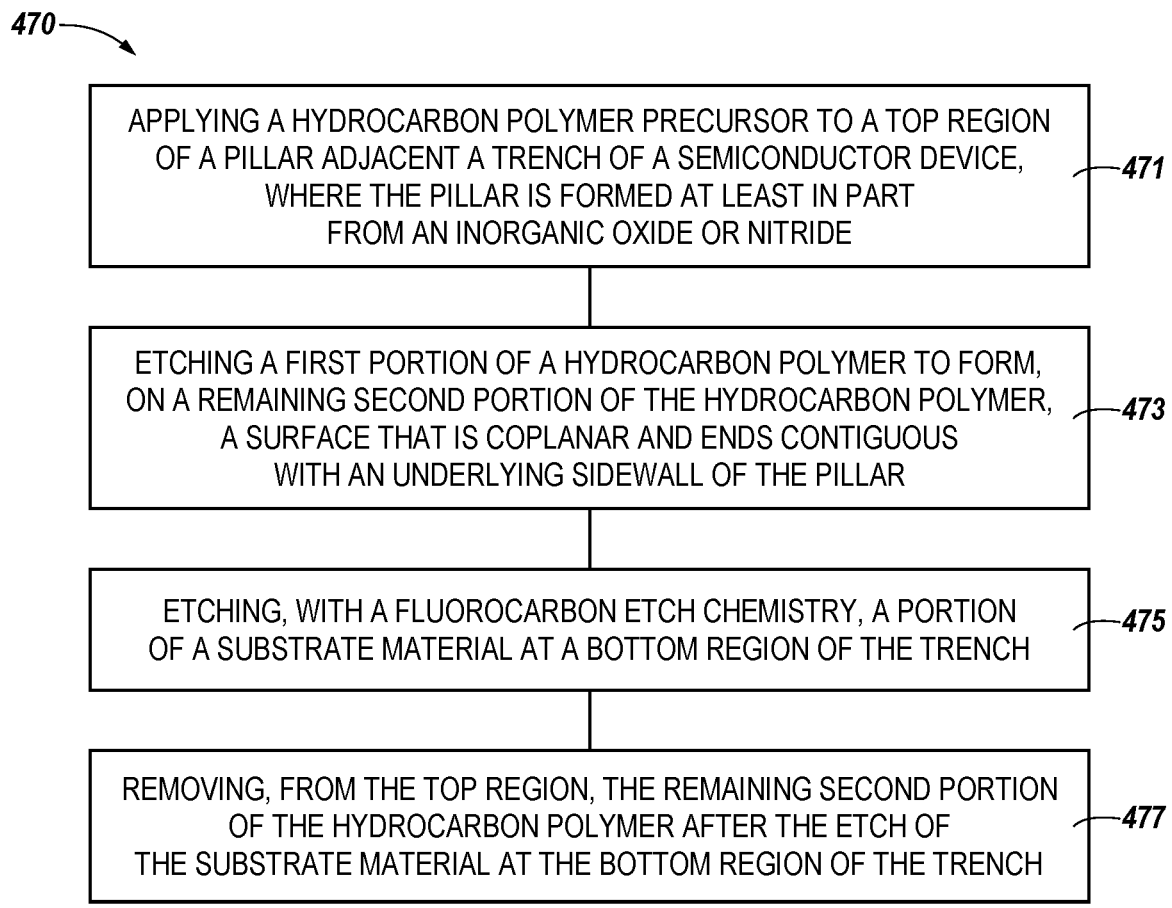
FIG. 4 is a flow diagram of another example method for using passivation material for pillars adjacent a trench in accordance with a number of embodiments of the present disclosure.

FIG. 4 is a flow diagram of another example method 470 for using passivation material for pillars adjacent a trench in accordance with a number of embodiments of the present disclosure. At block 471, the method 470 may include applying a hydrocarbon polymer precursor to a top region of a pillar adjacent a trench of a semiconductor device, where the pillar is formed at least in part from an inorganic oxide and/or nitride (e.g., as described in connection with point 141-1-1 in FIG. 1). At block 473, the method 470 may include etching a first portion of a hydrocarbon polymer to form, on a remaining second portion of the hydrocarbon polymer, a surface that is coplanar and ends contiguous with an underlying sidewall of the pillar (e.g., as described in connection with point 141-2-1 in FIG. 1). At block 475, the method 470 may include etching, with a fluorocarbon etch chemistry, a portion of a substrate material at a bottom region of the trench (e.g., as described in connection with point 141-3-1 in FIG. 1). At block 477, the method 470 may include removing, from the top region, the remaining second portion of the hydrocarbon polymer after the etch of the substrate material at the bottom region of the trench (e.g., as described in connection with point 141-4-1 in FIG. 1).

As described herein, a portion of a memory device (e.g., as shown at points 141-4-1 and/or 141-4-2 in FIG. 1) may be formed by the method recited in boxes 471-477 of FIG. 4. In various embodiments, the memory device may include an array of memory cells in a first memory device that includes at least one volatile memory cell or an array of memory cells in a second memory device that includes at least one non-volatile memory cell.

The method 470 may, in a number of embodiments, further include (e.g., as described in connection with FIG. 1) forming the hydrocarbon polymer precursor from at least one of $CH_4$, $C_2H_2$, $CH_2CH_2$, CH3CH3, and/or $CH_3CH_2CH_3$. The method 470 may further include using at least one of a combination of $CF_4$ and $SO_2$, a combination of $NF_3$ and $SO_2$, and/or an $O_2$ based etch chemistry to etch the first portion of the hydrocarbon polymer. The method 470 may further include using at least one of an oxidated compound etch chemistry and an $O_2$ plasma to remove the remaining second portion of the hydrocarbon polymer. The method 470 may further include forming the substrate material from at least one of an inorganic oxidated compound, an inorganic nitrogenated compound, an inorganic silicide or silicate compound, and/or a polysilicon compound.

The method 470 may further include, prior to applying the hydrocarbon polymer precursor to the top region of the pillar, forming a mask 633 from a fluoridated material on a top surface of the pillar (e.g., as described in connection with FIG. 6), and leaving the remaining second portion of the hydrocarbon polymer on the top region to protect the mask and/or the top surface of the pillar from a subsequent etch of the substrate material.

In a number of embodiments, the method 470 may further include forming a capacitor 629 in the trench after the substrate material is etched to an intended depth (e.g., as described in connection with FIG. 6). The capacitance of the capacitor 629 may be increased based on an increased volume and/or surface area of the capacitor caused at least in part by an increased depth of the trench.

The method 470 may further include performing, in addition to an original cycle 145-1 as recited in boxes 471-477, one or more additional cycles of etching an additional portion of the substrate material (e.g., as shown at cycles 145-2 and 145-N and described in connection with FIG. 1). The one or more additional cycles may be performed by performing a corresponding number of additional iterations of the elements recited in in boxes 471-477 to remove additional portions of the substrate material to achieve the intended depth of the trench. As described herein, each additional cycle may begin with applying a fresh hydrocarbon polymer precursor to the top region of the pillar after removal of the second portion of the hydrocarbon polymer remaining from a preceding cycle.

As an AR increases for trenches, it may become more challenging to preserve as much of the materials in the top region as possible during a punch etch being performed at the bottom region of the trench, in addition to removing materials that may have unintendedly accumulated in the bottom region. The fabrication processes and sequences described herein may be applicable to various memory configurations (e.g., DRAM, NAND, etc.) in which such punch etches may be performed to deepen a trench in order to reduce probabilities of one or more of the unintended consequences described herein. In addition to punch etch applications, utilizing the passivation material and cycles of fabrication sequences described herein also may be applied to other processes that may benefit from preservation of material in a top region, such as a spacer etch, a profile improvement and/or foot reduction operation, and/or etch mask preservation, among other applications.

Figure 5:
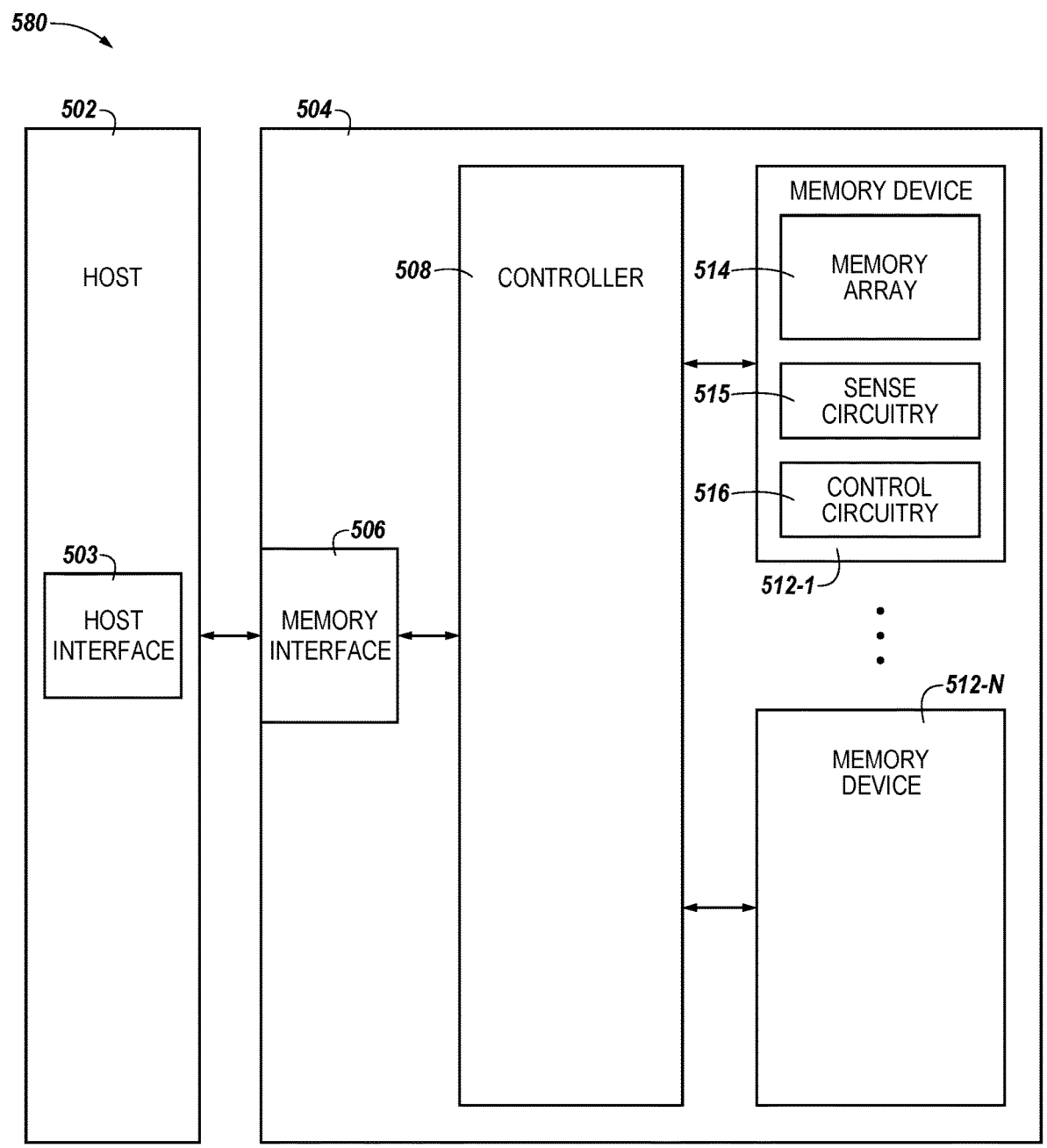
FIG. 5 is a functional block diagram of a computing system including at least one memory system in accordance with one or more embodiments of the present disclosure.

FIG. 5 is a functional block diagram of a computing system 580 including at least one memory system 504 in accordance with one or more embodiments of the present disclosure. Memory system 504 may be, for example, a solid-state drive (SSD).

In the embodiment illustrated in FIG. 5, memory system 504 includes a memory interface 506, a number of memory devices 512-1, . . . , 512-N, and a controller 508 selectably coupled to the memory interface 506 and memory devices 512-1, . . . , 512-N. Memory interface 506 may be used to communicate information between memory system 504 and another device, such as a host 502. Host 502 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 502 may be associated with fabrication operations performed on semiconductor devices and/or SSDs using, for example, a processing apparatus shown at 251 and described in connection with FIG. 2.

In a number of embodiments, host 502 may be associated with (e.g., include or be coupled to) a host interface 503. The host interface 503 may enable input of scaled preferences (e.g., in numerically and/or structurally defined gradients) to define, for example, critical dimensions (CDs) of a final structure or intermediary structures of a memory device (e.g., as shown at 512) and/or an array of memory cells (e.g., as shown at 514) formed thereon to be implemented by the processing apparatus 251. The scaled preferences may be provided to the host interface 503 via input of a number of preferences stored by the host 502, input of preferences from another storage system (not shown), and/or input of preferences by a user (e.g., a human operator).

Memory interface 506 may be in the form of a standardized physical interface. For example, when memory system 504 is used for information (e.g., data) storage in computing system 580, memory interface 506 may be a serial advanced technology attachment (SATA) interface, a peripheral component interconnect express (PCIe) interface, or a universal serial bus (USB) interface, among other physical connectors and/or interfaces. In general, however, memory interface 506 may provide an interface for passing control, address, information, scaled preferences, and/or other signals between the controller 508 of memory system 504 and a host 502 (e.g., via host interface 503).

Controller 508 may include, for example, firmware and/or control circuitry (e.g., hardware). Controller 508 may be operably coupled to and/or included on the same physical device (e.g., a die) as one or more of the memory devices 512-1, . . . , 512-N. For example, controller 508 may be, or may include, an ASIC as hardware operably coupled to circuitry (e.g., a printed circuit board) including memory interface 506 and memory devices 512-1, . . . , 512-N. Alternatively, controller 508 may be included on a separate physical device that is communicatively coupled to the physical device (e.g., the die) that includes one or more of the memory devices 512-1, . . . , 512-N.

Controller 508 may communicate with memory devices 512-1, . . . , 512-N to direct operations to sense (e.g., read), program (e.g., write), and/or erase information, among other functions and/or operations for management of memory cells. Controller 508 may have circuitry that may include a number of integrated circuits and/or discrete components. In a number of embodiments, the circuitry in controller 508 may include control circuitry for controlling access across memory devices 512-1, . . . , 512-N and/or circuitry for providing a translation layer between host 502 and memory system 504.

Memory devices 512-1, . . . , 512-N may include, for example, a number of memory arrays 514 (e.g., arrays of volatile and/or non-volatile memory cells). For instance, memory devices 512-1, . . . , 512-N may include arrays of memory cells, such as a portion of an example memory device 690 structured to include pillars and adjacent trenches described in connection with FIG. 6. As will be appreciated, the memory cells in the memory arrays 514 of memory devices 512-1, . . . , 512-N and/or as shown at 690 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 512, 690 may be formed on the same die. A memory device (e.g., memory device 512-1) may include one or more arrays 514 of memory cells formed on the die. A memory device may include sense circuitry 515 and control circuitry 516 associated with one or more arrays 514 formed on the die, or portions thereof. The sense circuitry 515 may be utilized to determine (sense) a particular data value (e.g., 0 or 1) that is stored at a particular memory cell in a row of an array 514. The control circuitry 516 may be utilized to direct the sense circuitry 515 to sense particular data values, in addition to directing storage, erasure, etc., of data values in response to a command from host 502 and/or host interface 503. The command may be sent directly to the control circuitry 516 via the memory interface 506 or to the control circuitry 516 via the controller 508.

The embodiment illustrated in FIG. 5 may include additional circuitry that is not illustrated so as not to obscure embodiments of the present disclosure. For example, memory devices 512, 690 may include address circuitry to latch address signals provided over I/O connectors through I/O circuitry. Address signals may be received and decoded by a row decoder and a column decoder to access a memory array 514. It will be appreciated that the number of address input connectors may depend on the density and/or architecture of memory devices 512, 690 and/or memory arrays 514.

Figure 6:
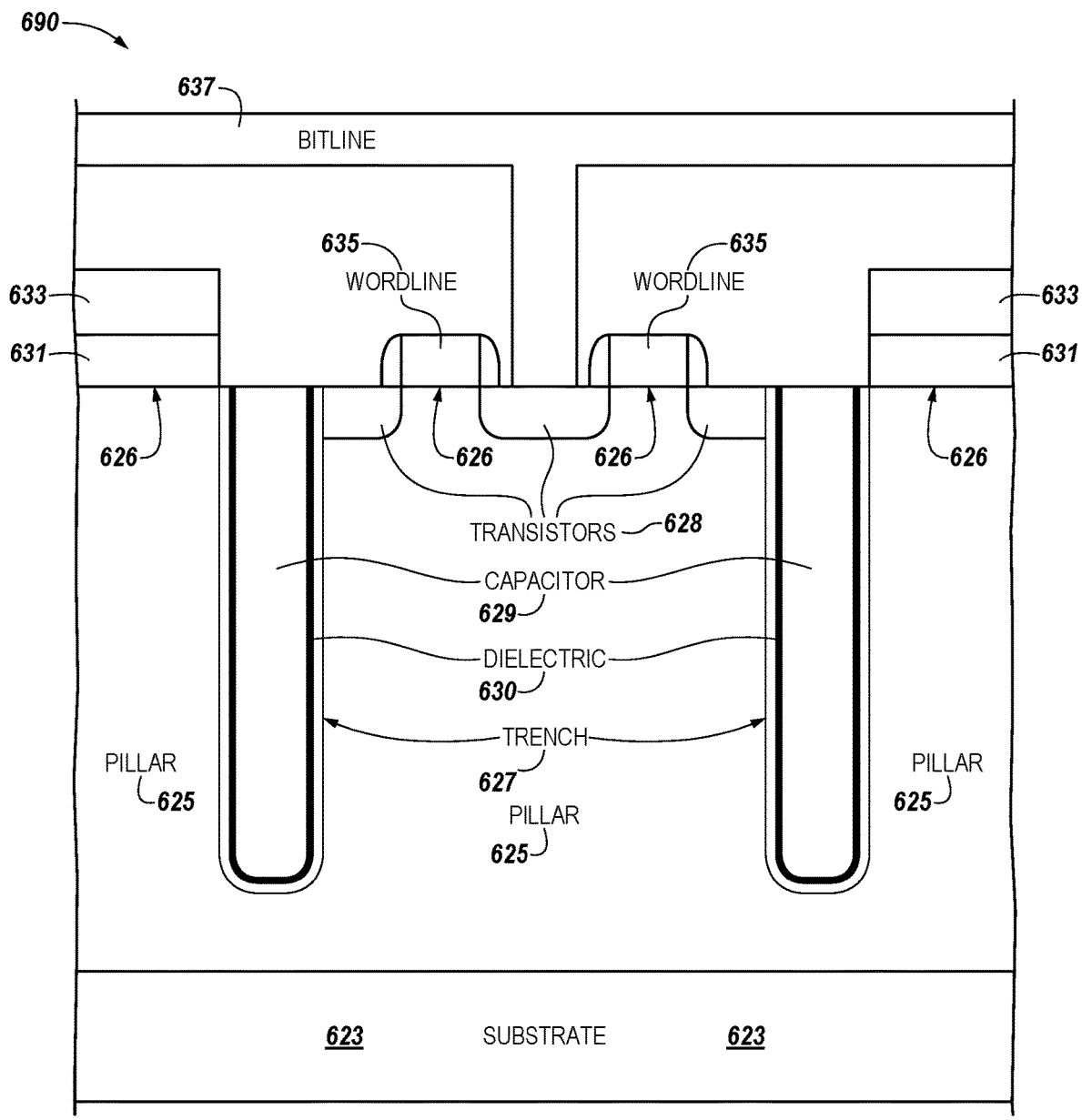
FIG. 6 illustrates a cross-sectional view of a portion of an example of semiconductor structures of a memory device that include pillars and adjacent trenches in accordance with a number of embodiments of the present disclosure.

FIG. 6 illustrates a cross-sectional view of a portion of an example of semiconductor structures of a memory device 690 that include pillars and adjacent trenches in accordance with a number of embodiments of the present disclosure. The portion of the memory device 690 illustrated in FIG. 6 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 628 and capacitors 629 are shown to be arranged in a lateral configuration, embodiments may include the transistors 628 and capacitors 629 being arranged in a lateral, a vertical, or any other configuration.

The portion of the memory device 690 shown in FIG. 6 may represent two DRAM memory cells in a 1T1C (one transistor one capacitor) configuration or one DRAM memory cell in a 2T2C configuration. DRAM memory cells may utilize capacitors 629 each formed in a trench 627 to store a particular charge corresponding to a data value. Forming the trenches 627 as shown in FIG. 6 may result in a pillar 625 being formed from the etched material on each side of a trench 627. Pillars 625 may be formed (e.g., fabricated) as layers of doped or undoped semiconductor material deposited on a substrate material 623. The semiconductor material may be etched to form the pillars 625 and trenches 627. In some embodiments, an opening (e.g., a round, square, oblong, etc., opening rather than a rectilinear trench) may be etched into the semiconductor material and capacitor material may be deposited in the opening, although such a configuration does not affect the concept of passivation material for pillars adjacent a trench described herein.

Moreover, embodiments of the present disclosure are not limited to capacitors being formed in a trench for data storage, nor are embodiments limited to the trench containing capacitor material. For example, various types of memory devices may include trenches between sidewall structures (e.g., pillars) in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 627 may be etched to a particular depth into a pillar material. The trench 627 may be etched into the material of the pillars 625 to a depth approaching the substrate material 623, as shown in FIG. 6. Alternatively, the trench 127 may be etched into the material of the pillars 125 to a top of or into the substrate material 123, as shown in FIG. 1. The depth of the trench 127, 627 approaching, at the top of, and/or into the substrate material 123, 623 is termed herein as being in the bottom region of the trench.

As described herein, deepening (e.g., etching) the trench further into the pillar material or the substrate material may increase a surface area of the trench boundaries. In one example, increasing the surface area of the trench boundaries may increase a capacitance of a capacitor 629 formed in the trench 627 (e.g., by increasing a volume and/or surface area of the capacitor). In this example, the trench 627 may be lined with a dielectric material 630 and a capacitor material may be formed (e.g., deposited) within the trench 627 and on the dielectric material 630 to form the capacitor 229 to a particular (e.g., target) depth.

Each pillar 625 of the pillar material may extend to a particular height (e.g., as shown at 132 and described in connection with FIG. 1) above the substrate material 623. As such, each pillar 625 has a top surface 626 at the particular height. A number of structural materials may be formed on or in association with the top surface 626 of the pillar 625 adjacent the trench 627. For example, a particular material 631 may be formed to contribute to data access, storage, and/or processing (e.g., conductor, resistor, and/or dielectric materials). Such a material 631 may be formed on the top surface 626 of the pillar 625 adjacent the trench 627. A mask material 633 may be formed to protect an underlying material 631 and/or the top surface 626 of the pillar 625 adjacent the trench 627 from subsequent processing and/or wear encountered in use of the memory device 690. Other structural materials that may be formed (e.g., in a DRAM configuration as shown in FIG. 6) on or in association with the top surface 626 of the pillar 625 adjacent the trench 627. The other structural materials may include the transistors 628, wordlines 635, and/or bitlines 637, among other possible structural materials. The structural materials just described as being formed on and/or in association with the top surface 626 of the pillar 625 adjacent the trench 627 are termed herein as being in a top region of the pillar 625 and/or trench 627.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context.

While example embodiments including various combinations and configurations of passivation materials, semiconductor materials, underlying materials, mask materials, structural materials, pillar materials, dielectric materials, capacitor materials, substrate materials, memory devices, memory cells, pillars, top regions of pillars, trenches, bottom regions of trenches, sidewalls of the pillars and/or trenches, scaled preferences, critical dimensions, processing apparatuses, controllers, and/or hosts, among other materials and/or components related to passivation material for a pillar adjacent a trench, have been illustrated and described herein, embodiments of the present disclosure are not limited to those combinations explicitly recited herein. Other combinations and configurations of the passivation materials, semiconductor materials, underlying component materials, mask materials, structural materials, pillar materials, dielectric materials, capacitor materials, substrate materials, memory devices, memory cells, pillars, top regions of pillars, trenches, bottom regions of trenches, sidewalls of the pillars and/or trenches, scaled preferences, critical dimensions, processing apparatuses, controllers, and/or hosts related to passivation material for a pillar adjacent a trench than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
forming a passivation material on a top region of a pillar adjacent a trench of a semiconductor device;
removing a first portion of the passivation material to form, on a remaining second portion of the passivation material, a surface that is coplanar with an underlying sidewall of the pillar;
removing a portion of a substrate material at a bottom region of the trench; and
removing the remaining second portion of the passivation material from the top region.

2. The method of claim 1, further comprising:
prior to removing the remaining second portion of the passivation material from the top region;
leaving the remaining second portion on the top region to protect an underlying material of the top region from a subsequent removal of the substrate material.

3. The method of claim 1, further comprising:
prior to forming the passivation material on the top region of the pillar;
forming a material on a top surface of the pillar; and
leaving the remaining second portion on the top region to protect the material on the top surface and the top surface of the pillar from a subsequent removal of the substrate material.

4. The method of claim 1, wherein removing the first portion of the passivation material further comprises removing the passivation material formed on the underlying sidewall of the pillar.

5. The method of claim 1, wherein removing the first portion of the passivation material further comprises removing the passivation material formed at the bottom region of the trench.

6. The method of claim 1, further comprising reiterating the elements recited in claim 1 to remove an additional portion of the substrate material at the bottom region of the trench.

7. The method of claim 1, further comprising reducing a probability of an unintended effect on critical dimensions of the top region of the pillar and an adjacent trench relative to removal of the portion of the substrate material at the bottom region of the trench without performance of the other elements recited in claim 1.

8. The method of claim 7, further comprising reducing the probability of an unintended pinch-off of the trench adjacent the pillar caused by formation of the passivation material in one or more cycles on the top region of the pillar.

9. The method of claim 7, further comprising reducing the probability of an unintended removal of material associated with the top region of the pillar.

10. The method of claim 7, further comprising reducing the probability of an unintended accumulation of passivation material at the bottom region of the trench.

11. The method of claim 7, further comprising reducing the probability of an unintended increase in a width of at least a portion of the trench or an unintended increase in roughness of at least a portion of a sidewall of the trench.

12. A method, comprising:
applying a hydrocarbon polymer precursor to a top region of a pillar adjacent a trench of a semiconductor device, wherein the pillar is formed at least in part from an inorganic oxide or nitride;
etching a first portion of a hydrocarbon polymer to form, on a remaining second portion of the hydrocarbon polymer, a surface that is coplanar and ends contiguous with an underlying sidewall of the pillar;
etching, with a fluorocarbon etch chemistry, a portion of a substrate material at a bottom region of the trench; and
removing, from the top region, the remaining second portion of the hydrocarbon polymer after the etch of the substrate material at the bottom region of the trench.

13. The method of claim 12, further comprising forming the substrate material from at least one of an inorganic oxidated compound, an inorganic nitrogenated compound, an inorganic silicide or silicate compound, and a polysilicon compound.

14. The method of claim 12, further comprising forming the hydrocarbon polymer precursor from at least one of methane ($CH_4$), acetylene ($C_2H_2$), ethylene ($CH_2CH_2$), ethane ($CH_3CH_3$), and propane ($CH_3CH_2CH_3$).

15. The method of claim 12, further comprising using at least one of a combination of tetrafluoromethane ($CF_4$) and sulfur dioxide ($SO_2$), a combination of nitrogen trifluoride ($NF_3$) and $SO_2$, and an oxygen ($O_2$) based etch chemistry to etch the first portion of the hydrocarbon polymer.

16. The method of claim 12, further comprising using at least one of an oxidated compound etch chemistry and an oxygen ($O_2$) plasma to remove the remaining second portion of the hydrocarbon polymer.

17. The method of claim 12, further comprising:
prior to applying the hydrocarbon polymer precursor to the top region of the pillar;
forming a mask from a fluoridated material on a top surface of the pillar; and
leaving the remaining second portion of the hydrocarbon polymer on the top region to protect the mask and the top surface of the pillar from a subsequent etch of the substrate material.

18. The method of claim 12, further comprising:
performing, in addition to an original cycle as recited in claim 8, one or more additional cycles of etching an additional portion of the substrate material by;
performing a corresponding number of additional iterations of the elements recited in claim 8 to remove additional portions of the substrate material to achieve an intended depth of the trench;
wherein each additional cycle begins with applying a fresh hydrocarbon polymer precursor to the top region of the pillar after removal of the remaining second portion of the hydrocarbon polymer.

19. The method of claim 12, further comprising:
forming a capacitor in the trench after the substrate material is etched to an intended depth; and
increasing a capacitance of the capacitor based on an increased surface area of the capacitor caused at least in part by an increased depth of the trench.

20. A portion of a memory device formed by the method of claim 12, wherein the memory device comprises a first memory device that includes at least one volatile memory cell or a second memory device that includes at least one non-volatile memory cell.

21. A system, comprising:
a processing apparatus configured to enable formation of structural materials on and removal of structural materials from a semiconductor device; and
a controller configured to receive instructions from a host and, based on the instructions, direct the processing apparatus to:
form a passivation material on a top region of a pillar adjacent a trench;
remove a first portion of the passivation material to form, on a remaining second portion of the passivation material, a surface that is coplanar with an underlying sidewall of the pillar;

remove a portion of a substrate material at a bottom region of the trench; and remove the remaining second portion of the passivation material from the top region.

22. The system of claim 21, wherein:

the controller is further configured to implement the instructions to control a quantity of the passivation material that is formed on and removed from the top region of the pillar to adjust:

a quantity of material associated with the top region of the pillar that is removed;

a width of a least a portion of the trench;

a roughness of at least a portion of a sidewall of the trench; and a width of a least a portion of the pillar.

23. The system of claim 21, wherein the controller is further configured to implement the instructions to control a depth of the removal of the substrate material based at least in part on a quantity of the second portion of the passivation material remaining on the top region to protect an underlying material of the top region.

24. The system of claim 21, wherein the controller is further configured to implement the instructions to control a depth of the removal of the substrate material based at least in part on a number of iterations of the last four elements recited in claim 21.

25. The system of claim 21, wherein the system further comprises:

the host configured to generate the instructions related to formation and removal of the passivation material on the top region of the pillar and the removal of the substrate material at the bottom region of the trench; and an interface coupled to the host and configured to enable input of the instructions to be implemented by the processing apparatus based at least in part on performance of the last four elements recited in claim 21;

wherein the instructions are based at least in part on scaled preferences, to define critical dimensions of the semiconductor device, that determine final structures of the top region of the pillar, a sidewall of the pillar, a width of the pillar, a width of the trench, and a depth of the trench.

* * * * *